United States Patent
Biber

(10) Patent No.: US 10,379,177 B2
(45) Date of Patent: Aug. 13, 2019

(54) APPARATUS FOR VISUALLY MONITORING A MAGNETIC RESONANCE SCANNER

(71) Applicant: Siemens Healthcare GmbH, Erlangen (DE)

(72) Inventor: Stephan Biber, Erlangen (DE)

(73) Assignee: Siemens Healthcare GmbH, Erlangen (DE)

( * ) Notice: Subject to any disclaimer, the term of this patent is extended or adjusted under 35 U.S.C. 154(b) by 262 days.

(21) Appl. No.: 15/417,604

(22) Filed: Jan. 27, 2017

(65) Prior Publication Data

US 2017/0212191 A1 Jul. 27, 2017

(30) Foreign Application Priority Data

Jan. 27, 2016 (DE) .................. 10 2016 201 170

(51) Int. Cl.
*G01R 33/28* (2006.01)
*H04N 7/18* (2006.01)
*H04N 5/232* (2006.01)
*G01R 33/422* (2006.01)

(52) U.S. Cl.
CPC ......... *G01R 33/283* (2013.01); *G01R 33/422* (2013.01); *H04N 5/23293* (2013.01); *H04N 7/183* (2013.01)

(58) Field of Classification Search
CPC .... G01R 33/283; G01R 33/422; G01R 33/42; H04N 5/23293; H04N 7/183; A61B 5/0046

See application file for complete search history.

(56) References Cited

U.S. PATENT DOCUMENTS

| | | | |
|---|---|---|---|
| 2005/0273000 A1* | 12/2005 | Dinehart | A61B 5/055 600/410 |
| 2009/0058420 A1* | 3/2009 | Adachi | G01R 33/3692 324/322 |
| 2009/0273776 A1* | 11/2009 | Bittner | G01R 33/283 356/240.1 |
| 2010/0059679 A1 | 3/2010 | Albrecht | |
| 2013/0274590 A1 | 10/2013 | Auboiroux et al. | |
| 2014/0275970 A1* | 9/2014 | Brown | G01R 33/3692 600/413 |

* cited by examiner

*Primary Examiner* — Rishi R Patel
(74) *Attorney, Agent, or Firm* — Schiff Hardin LLP

(57) ABSTRACT

An apparatus for visually monitoring a magnetic resonance scanner situated in a room, which is screened by an RF screen, has a camera and a screen housing in the screened room, a data link, and a receiver outside the screened room. The camera and the receiver each have at least one interface to the data link, which exits the screened room at a room interface that has a filter. The camera and the screen housing are designed so that the screen housing reduces magnetic and/or electrical interaction of the camera with a magnetic field generated by the magnetic resonance scanner. The camera has a field of view for visual detection of at least a part of the magnetic resonance scanner and is configured to generate visual data. The data link transfers the visual data between the camera and the receiver.

14 Claims, 2 Drawing Sheets

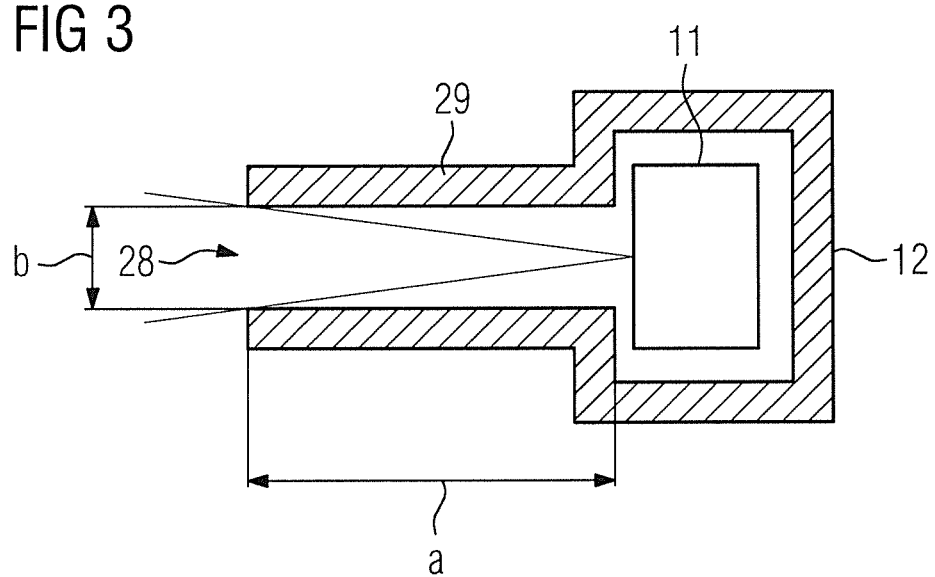

APPARATUS FOR VISUALLY MONITORING A MAGNETIC RESONANCE SCANNER

BACKGROUND OF THE INVENTION

Field of the Invention

The invention concerns an apparatus for visually monitoring a magnetic resonance scanner situated in a room that is screened by an RF screen, having a camera, a screen housing, a data link and a receiver.

Description of the Prior Art

Magnetic resonance imaging is based on the use of alternating electromagnetic fields (RF fields) generated by a magnetic resonance scanner and their interaction with a static magnetic field of at least 1.5 Tesla or 3 Tesla. In order not to impair the functioning of the magnetic resonance scanner, it is typically situated in a separate room that is screened by an RF screen so as to screen out fields generated by external sources and to prevent propagation outside the RF-screened room of the electromagnetic fields generated by the magnetic resonance scanner. Components situated in such an RF-screened room are subject to particular requirements so that their operation is not impaired by the operation of the magnetic resonance scanner and their operation does not impair the operation of the magnetic resonance scanner. When an object under examination, for example a patient, is examined with the magnetic resonance scanner, the object must of course be situated in the RF-screened room.

The control of the examination and the control of the magnetic resonance scanner is typically carried out outside the RF-screened room by a user (operator) of the magnetic resonance scanner. During an examination, it is typically required for the user to observe or monitor the patient visually. For this purpose, set into the wall of the RF-screened room. This window has the properties and functions of the RF screen and is also transparent. Such windows are usually produced specifically for magnetic resonance apparatuses and are fixedly built-in upon installation of the magnetic resonance apparatus.

SUMMARY OF THE INVENTION

An object of the invention is to provide an apparatus for visually monitoring a magnetic resonance scanner that is economical and, if needed, can be altered and/or exchanged.

The apparatus according to the invention for visually monitoring a magnetic resonance scanner situated in a room that is screened by an RF screen, has a camera, a screen housing, a data link and a receiver. The camera and the screen housing are arranged in the screened room, with the screen housing at least partially surrounding the camera. The receiver is arranged outside the screened room. The camera and the receiver each have at least one interface to the data link. The data link exits the room that is screened by the RF screen at a room interface, the room interface having a filter. The camera and the screen housing are arranged such that the screen housing reduces magnetic and/or electrical interaction of the camera with a magnetic field generated by the magnetic resonance scanner. The camera has a field of view that allows visual detection of at least a part of the magnetic resonance scanner and is configured to generate visual data representing that visual detection. The data link is configured to transfer the visual data between the camera and the receiver.

The camera is a device with which visual data are acquired within the field of view of the camera. Visual data are information that with further processing if necessary, can be reproduced pictorially. The camera can acquire image information of objects in its field of view. The field of view is the spatial region that the camera can optically detect, preferably in one position and orientation. Objects situated in the field of view can be detected by the camera as visual data, while objects situated outside the field of view cannot be detected as visual data. The camera is oriented such that at least a part of the magnetic resonance scanner lies within its field of view. The field of view of the camera is preferably oriented directly toward the region of the magnetic resonance scanner in which the patient being examined is situated during an examination. The camera can be mounted, for example, by a ball joint, on a wall, preferably on the inside surface of a wall of the screened room.

The visual data acquired by the camera are transferred to the receiver via the data link. Both the camera and the receiver are connected to the data link by at least one interface. The receiver can be, for example, a portion of the data line situated outside the RF-screened room. The receiver can be, for example, a device connected to the data link that can process the visual data into images and/or store the visual data. For this purpose, the receiver can include a computer, for example, a processor or a storage unit.

Due to the positions of the camera and the receiver and the fact that the camera is situated in a room that is screened by an RF screen, the data link penetrates the RF screen at least at one site, which can also be designated the room interface. Special requirements typically apply at the room interface since the RF screen preferably still fulfills its function at the room interface, in particular the screening of electromagnetic fields. Furthermore, the transferring of visual data and/or further data via the data link is preferably not impaired. The room interface has a filter that performs the function of the RF screen at the room interface.

The camera is surrounded by a screen housing that is designed to screen the camera extensively against the magnetic and/or electromagnetic fields generated by the magnetic resonance device so that these fields do not restrict the functioning of the camera. Furthermore, the screen housing preferably also screens against electrical and/or magnetic fields generated by the camera, so that these fields do not influence the functioning of the magnetic resonance scanner. The screen housing preferably surrounds the camera such that it has only one opening. The opening is preferably as small as possible and is configured such that the field of view of the camera is not restricted. The apparatus according to the invention preferably has no galvanic connection to the magnetic resonance scanner. Preferably, the only galvanic connection that exists between the apparatus according to the invention and a component not included in the apparatus is between the data link and the RF screen at the room interface.

An advantage of the apparatus according to the invention for visual monitoring is that it also enables a monitoring of the magnetic resonance scanner during an examination of a patient. Depending on the selection of the field of view of the camera, not only the magnetic resonance scanner, but also the patient can be monitored. For this purpose, the field of view can be set once or specifically for each examination. The apparatus can replace a window that has the properties and functions of the RF screen and is also transparent. The apparatus according to the invention is typically more economical than a window of this type in the RF screen. It has been recognized that, due to the functioning and sensitivity of the magnetic resonance scanner, an apparatus for a visual monitoring using a camera makes special demands on the camera. Cameras that are specifically developed for use in combination with a magnetic resonance scanner so as to be electromagnetically compatible therewith can be used for such monitoring. Cameras with such special requirements are complex to develop and, due to a low demand and being highly specialized, are expensive compared with conventional cameras. Conventional devices and/or commercial components are commonly available devices and/or components that are typically produced in large numbers and in a wide variety.

Due to the screen housing and filters of the inventive apparatus, a conventional camera, for example, a video camera and/or a conventional data link can be used for transferring the visual data. Such devices are typically mass produced products and available in a wide variety. An individual camera adapted to the user or the desired position of the camera can be selected. Furthermore, the maintenance and/or servicing of the camera and the data link is less complex and more economical than for components specifically developed for magnetic resonance devices. Set-up or positioning of the camera can advantageously also be carried out by a person without specialized training.

In an embodiment of the apparatus according to the invention, the data link exits a region that is surrounded at least partially by the screen housing at a screen interface, this screen interface including a filter. If the camera is not completely surrounded by the screen housing, then the data link can lead away from the part of the camera not surrounded by the screen housing. For a particularly good screening effect of the screen housing, it is advantageous for the screen housing to surround the camera as completely as possible without restricting the field of view of the camera. For this purpose, the screen housing preferably has an opening coinciding with the size of the field of view of the camera at the point where the field of view passes through the screen housing. Since the data link creates a link between the camera and a receiver outside the screened room, the data link can exit through the opening of the screen housing or can exit the screen housing at the screen interface. The interface of the camera is typically provided in the region of the camera facing away from the field of view, so that it is advantageous for the screen housing to have a screen interface with a filter so that the data link can exit the screen housing at a filtered site. The filter is typically an RF filter. The filter is configured such that the functioning of the screen housing is not impaired by the screen interface.

In a further embodiment of the apparatus according to the invention, the screen interface has a data transfer apparatus on the side facing away from the camera for a plug-in connection for a data transfer. If the apparatus according to the invention is configured so that the data link crosses the screen housing at the screen interface, then a plug-in connection can be mounted or integrated on the screen housing. The plug-in connection is part of a data transfer apparatus. The data transfer apparatus can connect the data link from within the screen housing to the data link from outside the screen housing, wherein externally a plug fitting the plug-in connection can be mounted on the plug connection such that a connection is created between the camera and the receiver, and the transfer of visual data can take place via the data transfer apparatus. The plug-in connection is preferably a conventional interface suitable for the transferring of data, so that a conventionally available data link can be connected by a conventional plug to the screen housing, and thus to the camera.

An advantage of this embodiment is that the data link can be connected outside the screen housing by a plug-in connection to the camera. For a conventional data link, any filters that are required are integrated into the screen interface and into the room interface so that a conventional data link can be produced by the use of a conventional plug between the camera and the receiver. The screen housing, together with a commercial camera, can form a unit which can also be positioned by a non-technically trained person in the screened room and can be connected to the receiver by the plug-in connection. The apparatus according to the invention thus enables the use of further commercial components, which enables economical production. If, for example, an exchange or repair of the camera or the data link is needed, then the camera and the data link can be separated from one another more easily so that preferably no specialist (technician) is required for this task.

In another embodiment of the apparatus according to the invention, at least the part of the data link situated in the screened room is a cable-based connection. There are numerous commercial standards for cable-based data transfer. Examples thereof are USB, LAN, etc. If the apparatus according to the invention comprises a cable-based data link, then for a filter which is integrated, for example, into the screen interface or into the room interface, preferably a low-pass filter or a narrow band-stop filter can be used which blocks frequencies in a pre-determined frequency band, whereas the frequencies outside the frequency band can be transferred, preferably unhindered. The frequency band is preferably selected so that the Larmor frequency of the magnetic resonance device lies within the frequency band. The electromagnetic fields generated by the magnetic resonance device typically correspond approximately to the Larmor frequency which is defined by the strength of the static magnetic field of the magnetic resonance device.

An advantage of this embodiment is that a cable-based data link is typically reliable and relatively non-susceptible to faults. A number of conventional cables that are suitable for a data link are available, and enable a cost-effective apparatus according to the invention. Filters, in particular narrow band-stop filters, can be integrated into the cable-based data link, with their functioning being retained largely unaltered.

In another embodiment of the apparatus according to the invention, at least a part of the data link situated within the screened room is a wireless connection, and the apparatus has a first antenna and a second antenna in the screened room. The camera is connected to the first antenna and the second antenna is connected to the room interface.

There are numerous commercial standards for wireless data transfer. Examples thereof are WLAN (IEEE standard 802.11) and all derivatives and/or extensions thereof, wireless USB, industrial WLAN, wireless HDMI, etc. The examples given typically use frequencies for data transfer which differ distinctly from the Larmor frequency of the magnetic resonance device (typically 64 MHz or 128 MHz). Thus, for example, WLAN uses frequencies in the range of 2 GHz to 60 GHz.

Antennae with a high directionality are preferably used. Advantageously, the antennae are oriented so that fields emitted by them propagate in a direction differing from the direction facing the patient receiving region. The first and second antennae are preferably arranged such that a visual connection exists between both antennae. A visual connection exists when the shortest distance between both antennae is in the air and is not interrupted by any objects. A visual connection between the first and second antennae can arise if the second antenna is mounted within the field of view of the camera on the magnetic resonance device.

The filter used in the apparatus according to the invention, such as the filter integrated into the room interface, is preferably transparent at least for the frequency used by the wireless data link. Preferably, the filter blocks all frequencies not used by the wireless data link and/or the Larmor frequency of the magnetic resonance device. The data link outside the screened room can take place cable-based and/or wirelessly.

An advantage of this embodiment of the apparatus according to the invention is that additional cables within the RF-screened room can be largely dispensed with due to the design of the apparatus. The apparatus can thus be positioned more flexibly. Due to the different frequency ranges to be used, an interaction of the data link with the MR imaging can be prevented.

In another embodiment of the apparatus according to the invention, the apparatus has a third antenna and a fourth antenna, and the data link exits a region at a screen interface that is at least partially surrounded by the screen housing and the screen interface has a filter. The third antenna is arranged in the region at least partially surrounded by the screen housing and is directly linked to the camera. The fourth antenna is mounted on the side of the screen interface facing the camera and the first antenna is mounted on the side of the screen interface facing away from the camera.

In this embodiment, therefore, a third and a fourth antenna are situated within the screen housing. A direct connection preferably exists between the third antenna and the camera. This means that the third antenna is directly integrated into the camera or is connected thereto via a cable-based data link.

An advantage of this embodiment is that a commercial camera that has, for example, a WLAN interface can be used. On use of WLAN as a wireless data link, this WLAN interface can be regarded as a third antenna. The screen housing would restrict the range of the third antenna. If the fourth antenna is integrated within the screen housing, then visual data can be passed from the fourth antenna to the first antenna, which transfers the visual data wirelessly to the second antenna which is connected to the room interface. A further advantage of this embodiment is that the camera can be integrated easily into the screen housing and removed therefrom, since no data link via a cable which must be created or interrupted. The camera can thus be used flexibly and, if necessary, exchanged. It is conceivable for the camera to be used only for particular examinations, and can also be used for other purposes independently of the magnetic resonance apparatus. This results in a cost advantage.

In another embodiment of the apparatus according to the invention, the apparatus has at least one module in order to increase the range of the wireless connection. In the wireless transference of data, the received signal can be weaker than the emitted signal, for example, due to attenuation or the distance between the transmitting and receiving antennae. Such a relationship is typically defined by the power transfer balance. The power transfer balance can typically be improved by the use of a module for increasing the range. Such a module for wireless transfer via WLAN can be, for example, a repeater. The module for increasing the range is preferably situated in the screened room. The module for increasing the range is preferably situated between the first and second antennae. Alternatively or additionally, a module for increasing the range can be integrated into the room interface.

An advantage of the integration of a module for increasing the range of the wireless connection is an improved signal intensity of the visual data. Consequently, the visual data passed to the receiver are of higher quality and/or the stability of the wireless connection can be improved.

In another embodiment of the apparatus according to the invention, the screen housing has a hollow conductor and the field of view of the camera faces in the direction of the hollow conductor.

In the region of the field of view of the camera, the screen housing preferably has a hollow conductor. The hollow conductor is preferably configured so that fields generated by the camera are screened by the screen housing from the external region of the screen housing at least in the region of the field of view of the camera. The hollow conductor is preferably configured so that fields generated by the magnetic resonance device are screened by the screen housing from the internal region of the screen housing at least in the region of the field of view of the camera. The hollow conductor is preferably smaller than the camera so that the effect of the screening is enhanced in the region of the field of view.

For this purpose, the extent of the hollow conductor along the axis of symmetry of the field of view is typically at least double, preferably approximately four times as long as the extent of the hollow conductor in a direction perpendicular thereto. The size and shape of the hollow conductor is preferably selected so that a high effect of the screening is achieved in the region of the field of view without restriction of the field of view. The hollow conductor is typically rectangular or round. The camera is preferably mounted in the screen housing behind a barrier so that it is ensured that the camera is mounted at the required depth of the hollow conductor so that the hollow conductor can have a screening effect. This barrier can be, for example, a glass pane, a mechanical stop or an apertured diaphragm.

An advantage of the hollow conductor integrated into the screen housing is that the screening effect of the screen housing can be improved by the selection of a suitable geometry, and the field of view of the camera is not restricted. The efficiency of the screen housing can thus be increased economically.

In a further embodiment of the apparatus according to the invention, the screen housing has an optically transparent screen region in the field of view of the camera.

The transparent screen region is part of the screen housing and is preferably configured so that fields generated by the camera are screened by the screen housing from the external region of the screen housing, at least in the region of the field of view of the camera. The transparent screen region is preferably configured so that fields generated by the magnetic resonance device are screened by the screen housing from the internal region of the screen housing at least in the region of the field of view of the camera. The screen region is typically an RF screen. The screen region is designed such that the detection by the camera of visual data in the field of view of the camera is still possible. For example, the screen region can be grid-form metal that is at least partially optically transparent. A screen region of this type can be used alternatively or additionally to the hollow conductor. An advantage of the screen region is an improved and cost-effective screen effect of the screen housing in the region of the field of view of the camera.

In another embodiment of the apparatus according to the invention, the camera has an input port connected via an electrical line to an output port of an energy source, and the electrical line contains at least one low-pass filter. For an external energy supply of the camera, this electrical line can connect the camera to the energy source. The energy source can be, for example, a commercial socket in the screened room or an electrical line outside the screened room. Typically, the electrical energy supply is an alternating current at 50 Hz. The frequency of the alternating current is lower than the Larmor frequency, so that higher frequencies of the electrical line are preferably eliminated by the low-pass filter. The interaction between the electrical energy supply and the fields generated by the magnetic resonance device can be largely eliminated thereby. An advantage of the embodiment of the apparatus according to the invention is that the energy supply of the camera can be achieved using commercial components, and an interaction of the electrical current thereby occurring with the magnetic resonance device can be eliminated.

In another embodiment of the apparatus according to the invention, the electrical line has a current interface with the screen housing and, at the side facing away from the camera, the current interface has a conducting apparatus for an electrical plug-in connection.

For a particularly good screening effect of the screen housing, it is advantageous for the screen housing to substantially completely surround the camera. For this purpose, the screen housing has an opening within the field of view of the camera. Since the electrical line creates a connection between the camera and an energy source, the electrical line can extend on one side through the opening of the screen housing or can exit the screen housing at the current interface. The input port of the camera is typically in the region of the camera facing away from the field of view of the camera so that it is advantageous if the screen housing has a current interface with a filter so that the electrical line can exit the screen housing at a filtered site. The filter can be, for example, a low-pass filter. The filter is configured such that the functioning of the screen housing is not impaired by the current interface.

An electrical plug-in connection can be mounted or integrated on the screen housing. The electrical plug-in connection is part of the conducting apparatus. The conducting apparatus can connect the electrical line from within the screen housing to the electrical line from outside the screen housing, wherein externally a plug fitting the electrical plug-in connection can be mounted on the plug-in connection such that a connection can be created between the e input port entry of the camera and the exit of the energy source. The plug-in connection is preferably a conventional interface suitable for an electrical line, so that a conventionally available electrical line can be connected by means of a conventional plug to the screen housing and thus to the camera. Examples of a conducting apparatus for an electrical plug-in connection are USB and RJ45 plug connections.

The current interface of the electrical line to the screen housing can also be integrated into the screen interface of the data link with the screen housing or the screen interface can be integrated into the current interface. In both cases, the current interface can form, together with the screen interface, a common interface of the screen housing. This common interface can have a number of filters and/or a filter which are/is preferably configured such that the data link and the electrical line are not impaired and the functioning of the screen housing is not impaired by the common interface. In the presence of a conducting apparatus and a data transfer apparatus, the two apparatuses can also be integrated in one another so that they have a common plug-in connection for the data transfer and for the electrical line.

An advantage of this embodiment of the invention is that the conducting apparatus has a conventional current interface which enables a flexible and simple connection and release of the energy source to/from the camera. This allows the camera to be used flexibly at different positions and/or to be easily connected to another energy source.

In another embodiment of the apparatus according to the invention, the electrical line is configured for energy supply to the camera with direct current. Preferably, a DC voltage is applied to the electrical line. An advantage of using a direct current is that the energy supply to the camera does not produce alternating fields that influence the functioning of the camera.

In another embodiment of the apparatus according to the invention, the receiver is connected to a display unit. The display unit is preferably located outside the screened room, and is connected to the receiver. Preferably, the receiver includes the display unit or the receiver is preferably integrated into the display unit. The display unit is typically a monitor on which the visual data, if necessary after processing thereof, are displayed as images to a user of the magnetic resonance device. The user preferably operates the magnetic resonance device so that he/she can simultaneously control the magnetic resonance device while monitoring a patient under examination. The user is herein typically situated outside the RF-screened room. The presentation of the visual data on a display unit enables comfortable monitoring of the patient for the user. The display unit can replace a window set into the wall to the RF-screened room.

In another embodiment of the apparatus according to the invention, the apparatus has a trigger, and the magnetic resonance scanner is configured to play out an MR control sequence, and the trigger is configured to interrupt and switch on the data link and/or the electrical connection and to synchronize with the MR control sequence to be played out by the magnetic resonance scanner.

Preferably, information relating to the MR control sequence to be played out by the magnetic resonance scanner is transferred to the trigger. An MR control sequence is configured to modulate nuclear spins in an examination object such that they generate a signal, which is recorded. For this purpose, an MR control sequence is composed of a sequence of RF pulses, in particular excitation pulses and refocusing pulses, as well as gradient pulses to be emitted suitably coordinated therewith. The gradient pulses generate dynamic magnetic field gradients which are used for spatial encoding. Temporally adapted thereto, readout windows must be set that specify the time frames within which the induced signals are acquired. Of particular importance for the imaging is the timing within the sequence, that is, defining temporal intervals at which pulses follow one another.

Upon the activation of such MR pulses, the functioning of the camera can be impaired. Furthermore, magnetic fields generated by the camera and insufficiently screened within particular periods of the MR control sequence can particularly strongly influence the MR imaging sequence, depending on the type of MR control sequence. The trigger is configured to synchronize the camera with the MR control sequence. For example, during emission of particular RF pulses, the camera can be switched off for some milliseconds, for example the electrical connection, i.e. the power supply, can be interrupted. Accordingly, no visual data are acquired and via the data link, no data are transferred to the receiver.

An advantage of this embodiment is that a mutual influencing of the apparatus according to the invention by the magnetic resonance scanner can be reduced in addition to the screening by the screen housing and the filter.

BRIEF DESCRIPTION OF THE DRAWINGS

FIG. 3 is a schematic illustration of a screen housing according to the invention.

DESCRIPTION OF THE PREFERRED EMBODIMENTS

Figure 1:
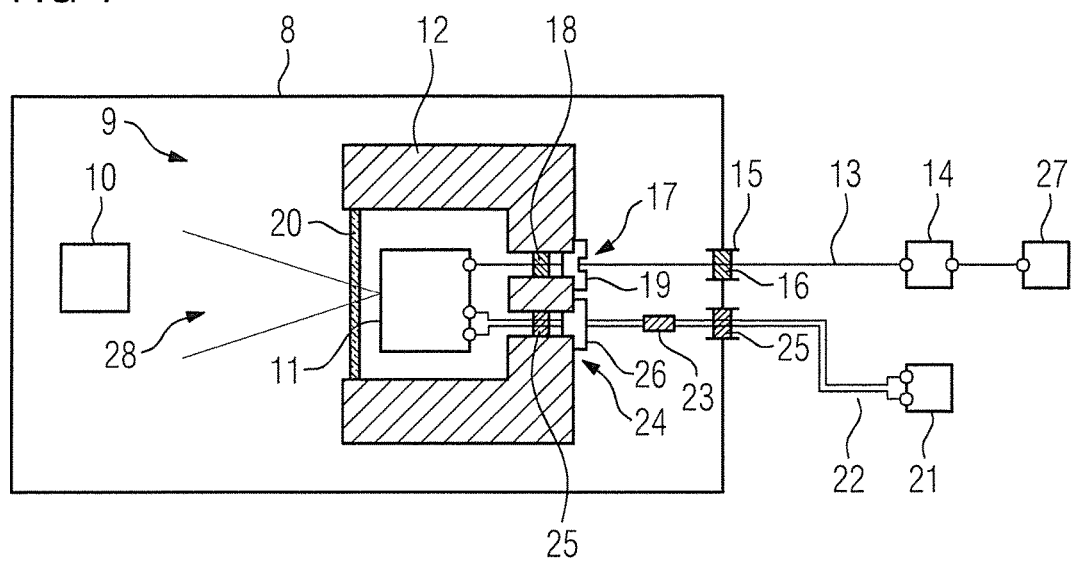
FIG. 1 is a schematic illustration of a first embodiment of an apparatus according to the invention.

FIG. 1 shows a schematic illustration of a first embodiment of an apparatus according to the invention for a visual monitoring of a magnetic resonance scanner 10 situated in a room 9, which is screened by an RF screen 8. The apparatus has a camera 11, a screen housing 12, a data link 13 and a receiver 14. The camera 11 can be, for example, a video camera. The camera 11 and the screen housing 12 are arranged in the screened room 9, with the screen housing 12 at least partially surrounding the camera 11. The receiver 14 is situated outside the screened room 9.

The camera 11 and the receiver 14 each have an interface to the data link 13 and the data link 13 exits the room 9 which is screened by the RF screen 8 at a room interface 15. The room interface 15 includes a filter 16. The filter 16 is an RF filter. The camera 11 and the receiver 14 can also have a number of interfaces with the data link 13. The data link 13 is configured to transfer visual data between the camera 11 and the receiver 14. The receiver 14 is preferably connected to a display unit 27 on which the visual data can be displayed to the user of the apparatus. The part of the data link 13 situated in the screened room 9 is preferably a cable-based connection, and outside the screened room 9, the data link 13 is also preferably cable-based. The data link 13 preferably exits a region surrounded at least partially by the screen housing 12 at a screen interface 17 wherein the screen interface 17 has a filter 18. At the side facing away from the camera 11, the screen interface 17 preferably has a data transfer apparatus 19 for a plug-in connection for a data transfer.

The camera 11 and the screen housing 12 are designed so that the screen housing 12 reduces magnetic interaction of the camera 11 with a magnetic field generated by the magnetic resonance scanner 10. The camera 11 has a field of view 28 for visual detection of at least a part of the magnetic resonance scanner 10 and is configured for generating visual data. The screen housing 12 preferably has an optically transparent screen region 20 in the field of view 28 of the camera 11.

The camera 11 preferably has an input port connected by an electrical line 22 to an output port of an energy source 21 and the electrical line 22 has a low-pass filter 23. The electrical line 22 can include two or more low-pass filters 23. The electrical line 22 preferably has a current interface 24 with the screen housing 12 and the current interface 24 has a filter 25. At the side facing away from the camera 11, the current interface 24 preferably has a conducting apparatus 26 for an electrical plug-in connection. The energy source 21 can be situated outside the RF-screened room 9. In that case, the interface at which the electrical line 22 penetrates the RF screen 8 preferably has a filter 25. This interface can also be integrated into the room interface 15. The electrical line 22 is preferably configured for energy supply to the camera 11 by direct current.

Figure 2:
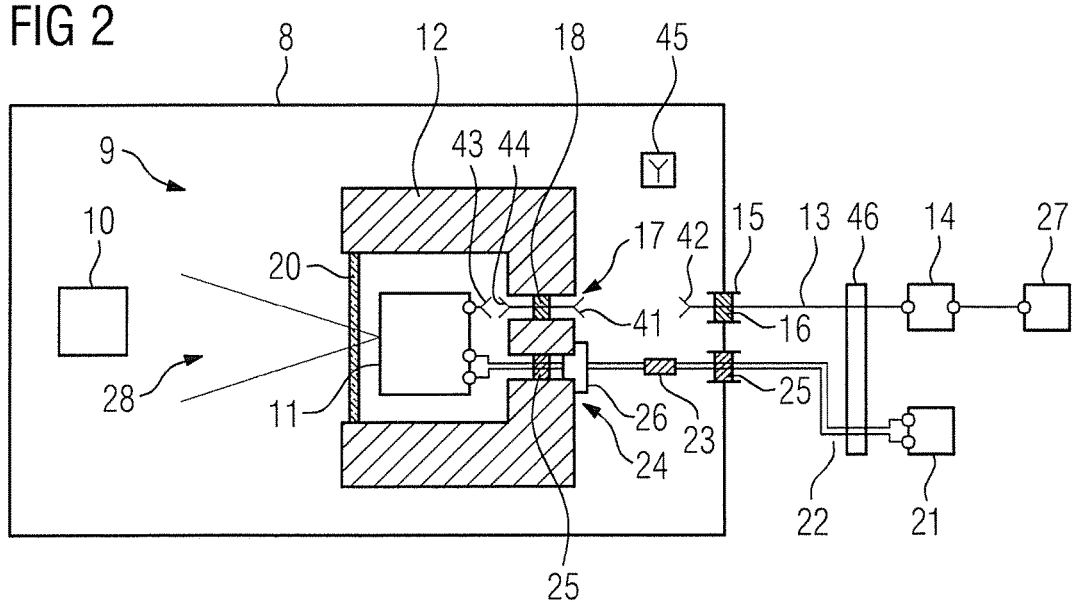
FIG. 2 is a schematic illustration of a second embodiment of an apparatus according to the invention.

FIG. 2 shows a schematic illustration of a second embodiment of an apparatus according to the invention. The first embodiment differs from the apparatus according to the invention shown in FIG. 1 in that the part of the data link 13 situated in the screened room 9 is a wireless connection. The apparatus has a first antenna 41 and a second antenna 42 in the screened room 9 and the camera 11 is connected to the first antenna 41 and the second antenna 42 is connected to the room interface 15. The data link 13 preferably exits a region surrounded at least partially by the screen housing 12 at a screen interface 17 and the screen interface 17 has a filter 18. The apparatus preferably has a third antenna 43 and a fourth antenna 44. The third antenna 43 is arranged in the region at least partially surrounded by the screen housing 12 and is directly connected to the camera 11. The fourth antenna 44 is preferably mounted on the side of the screen interface 17 facing toward the camera 11 and the first antenna 41 is mounted on the side of the screen interface 17 facing away from the camera 11. In order to increase a range of the wireless connection, the apparatus preferably has a module 45, or a number of such modules 45.

Furthermore, the apparatus preferably has a trigger 46. The magnetic resonance scanner 10 is configured to play out an MR control sequence. The trigger 46 is configured to interrupt and switch on the data link 13 and/or the electrical connection 22 in synchronization the particular MR control sequence to be played out by the magnetic resonance scanner 10.

FIG. 3 shows a schematic illustration of a screen housing 12 according to the invention. The screen housing 12 has a hollow conductor 29 and the field of view 28 of the camera 11 faces in the direction of the hollow conductor 29. The length a and the width b of the hollow conductor 29 are preferably in a ratio to one another such that the length a is at least twice as great as the width b of the hollow conductor 29, i.e. a>2b. The hollow conductor 29 can function particularly advantageously when the length a is approximately four times the width b of the hollow conductor 29, i.e. a≈4b. Advantageously, the width of the field of view 28 at the side of the hollow conductor 29 facing away from the camera 11 corresponds to the width b of the hollow conductor 29.

Although modifications and changes may be suggested by those skilled in the art, it is the intention of the Applicant to embody within the patent warranted hereon all changes and modifications as reasonably and properly come within the scope of the Applicant's contribution to the art.

The invention claimed is:

1. An apparatus for visual monitoring of a magnetic resonance scanner situated in a screened room that is screened by a radio-frequency (RF) screen, said apparatus comprising:
   a camera and a screen housing that at least partially surrounds said camera, said camera and said screen housing being situated in said screened room;
   a receiver situated outside of said screened room;
   said camera and said receiver each having an interface to a data link between said camera and said receiver;
   a room interface via which said data link exits said screened room, said room interface comprising a filter;
   said camera and said screen housing being configured so that the screen housing reduces at least one of magnetic interaction and electrical interaction of the camera with a magnetic field generated by the magnetic resonance scanner;

said camera having a field of view that encompasses at least a part of said magnetic resonance scanner, and said camera generating visual data that represent said at least a part of said magnetic resonance scanner;

said data link being configured to transfer said visual data between said camera and said receiver, with said data link comprising a portion formed as a wireless connection comprising a first antenna and a second antenna in said screened room, said camera being connected to said first antenna and said room interface being connected to said second antenna; and a module situated in said screened room between said first antenna and said second antenna that increases a range of said wireless connection.

2. An apparatus as claimed in claim 1 wherein said data link exits said screen housing at a screen interface comprising a filter.

3. An apparatus as claimed in claim 2 wherein said screen interface is situated at a side of said screen housing facing away from said camera, and comprises a data transfer interface for a plug-in connection for said transfer of said visual data.

4. An apparatus as claimed in claim 1 wherein said data link comprises at least a portion that is situated in said screened room, said portion being formed as a cable-based connection.

5. An apparatus as claimed in claim 1 comprising a third antenna and a fourth antenna, said data link exiting said screen housing via a screen interface comprising a filter, and said third antenna being situated in a region at least partially surrounded by the screen housing and being directly connected to the camera, said fourth antenna being mounted at a side of said screen interface facing toward said camera, and first antenna being mounted at a side of said screen interface facing away from said antenna.

6. An apparatus as claimed in claim 1 wherein said screen housing comprises a hollow conductor, and wherein said field of view of said camera faces a direction of said hollow conductor.

7. An apparatus as claimed in claim 1 wherein said screen housing comprises a transparent screen region situated in said field of view of the camera.

8. An apparatus as claimed in claim 1 wherein said camera comprises an input port connected via an electrical line to an output port of an energy source, said electrical line comprising at least one low-pass filter.

9. An apparatus as claimed in claim 8 wherein said electrical line comprises a current interface with said screen housing and wherein said current interface, at a side facing away from said camera, comprises a conducting apparatus for an electrical plug-in connection.

10. An apparatus as claimed in claim 8 wherein said electrical line is configured for energy supply to the camera by direct current.

11. An apparatus as claimed in claim 8 wherein said magnetic resonance apparatus is configured to execute an MR control sequence, and wherein said apparatus comprises a trigger configured to interrupt and complete said electrical line in synchronization with said MR control sequence.

12. An apparatus as claimed in claim 1 comprising a display monitor connected to said receiver.

13. An apparatus as claimed in claim 1 wherein said magnetic resonance scanner is configured to execute an MR control sequence, and said apparatus comprising a trigger configured to interrupt and switch on said data link in synchronization with said MR control sequence.

14. An apparatus for visual monitoring of a magnetic resonance scanner situated in a screened room that is screened by a radio-frequency (RF) screen, said apparatus comprising:

a camera and a screen housing that at least partially surrounds said camera, said camera and said screen housing being situated in said screened room;

a receiver situated outside of said screened room;

said camera and said receiver each having an interface to a data link between said camera and said receiver;

a room interface via which said data link exits said screened room, said room interface comprising a filter;

said camera and said screen housing being configured so that the screen housing reduces at least one of magnetic interaction and electrical interaction of the camera with a magnetic field generated by the magnetic resonance scanner;

said camera having a field of view that encompasses at least a part of said magnetic resonance scanner, and said camera generating visual data that represent said at least a part of said magnetic resonance scanner;

said data link being configured to transfer said visual data between said camera and said receiver, with said data link comprising a portion formed as a wireless connection comprising a first antenna and a second antenna in said screened room, said camera being connected to said first antenna and said room interface being connected to said second antenna; and said data link further comprising a third antenna and a fourth antenna, said data link exiting said screen housing via a screen interface comprising a filter, and said third antenna being situated in a region at least partially surrounded by the screen housing and being directly connected to the camera, said fourth antenna being mounted at a side of said screen interface facing toward said camera, and first antenna being mounted at a side of said screen interface facing away from said antenna.

* * * * *